(12) United States Patent
Tokunaga et al.

(10) Patent No.: US 11,720,024 B2
(45) Date of Patent: Aug. 8, 2023

(54) RESIST UNDERLAYER FILM-FORMING COMPOSITION CONTAINING INDOLOCARBAZOLE NOVOLAK RESIN

(71) Applicant: NISSAN CHEMICAL INDUSTRIES, LTD., Tokyo (JP)

(72) Inventors: Hikaru Tokunaga, Toyama (JP); Daigo Saito, Toyama (JP); Keisuke Hashimoto, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 17/880,761

(22) Filed: Aug. 4, 2022

(65) Prior Publication Data

US 2022/0404707 A1    Dec. 22, 2022

Related U.S. Application Data

(62) Division of application No. 15/780,657, filed as application No. PCT/JP2016/085561 on Nov. 30, 2016, now abandoned.

(30) Foreign Application Priority Data

Dec. 1, 2015 (JP) .................. 2015-235002

(51) Int. Cl.
| | |
|---|---|
| G03F 7/11 | (2006.01) |
| G03F 7/40 | (2006.01) |
| G03F 7/20 | (2006.01) |
| C08G 12/26 | (2006.01) |
| C08G 16/02 | (2006.01) |
| C09D 161/26 | (2006.01) |
| H01L 21/027 | (2006.01) |

(52) U.S. Cl.
CPC .............. *G03F 7/11* (2013.01); *C08G 12/26* (2013.01); *C08G 16/0268* (2013.01); *C09D 161/26* (2013.01); *G03F 7/2002* (2013.01); *G03F 7/2059* (2013.01); *G03F 7/40* (2013.01); *H01L 21/0274* (2013.01)

(58) Field of Classification Search
None
See application file for complete search history.

(56) References Cited

U.S. PATENT DOCUMENTS

| | | |
|---|---|---|
| 2005/0214674 A1 | 9/2005 | Sui et al. |
| 2009/0053647 A1 | 2/2009 | Enomoto et al. |
| 2010/0035181 A1 | 2/2010 | Sakaguchi et al. |
| 2012/0077345 A1 | 3/2012 | Saito et al. |
| 2012/0095132 A1 | 4/2012 | Chang et al. |
| 2013/0280913 A1 | 10/2013 | Shinjo et al. |
| 2014/0170567 A1 | 6/2014 | Sakamoto et al. |
| 2014/0235059 A1 | 8/2014 | Sakamoto et al. |
| 2014/0235060 A1 | 8/2014 | Shinjo et al. |
| 2015/0011092 A1 | 1/2015 | Someya et al. |
| 2015/0044876 A1 | 2/2015 | Nishimaki et al. |
| 2015/0248057 A1 | 9/2015 | Ohnishi et al. |
| 2016/0068709 A1 | 3/2016 | Endo et al. |
| 2016/0090449 A1 | 3/2016 | Nam et al. |
| 2016/0147151 A1 | 5/2016 | Shinjo et al. |
| 2016/0322216 A1 | 11/2016 | Mun et al. |
| 2017/0008843 A1 | 1/2017 | Kwon et al. |
| 2017/0018436 A1 | 1/2017 | Hatakeyama et al. |
| 2017/0097568 A1 | 4/2017 | Endo et al. |
| 2017/0198096 A1 | 7/2017 | Choi |
| 2017/0227850 A1 | 8/2017 | Nishimaki et al. |
| 2017/0315445 A1 | 11/2017 | Hashimoto et al. |
| 2018/0314154 A1 | 11/2018 | Saito et al. |
| 2019/0067021 A1 | 2/2019 | Kori et al. |

(Continued)

FOREIGN PATENT DOCUMENTS

| | | |
|---|---|---|
| JP | 06-228273 A | 8/1994 |
| JP | 11-043536 A | 2/1999 |

(Continued)

OTHER PUBLICATIONS

Feb. 28, 2017 International Search Report issued in International Patent Application No. PCT/JP2016/085561.
Feb. 28, 2017 Written Opinion issued in International Patent Application No. PCT/JP2016/085561.
Vijay Nair et al. "An Efficient Synthesis of Indolo[3,2-a]Carbazoles via the Novel Acid Catalyzed Reaction of Indoles and Diaryl-1,2-Diones". Organic & Biomolecular Chemistry, 2008, vol. 6, pp. 1738-1742.

*Primary Examiner* — Martin J Angebranndt
(74) *Attorney, Agent, or Firm* — Oliff PLC

(57) ABSTRACT

A resist underlayer film for lithography does not cause intermixing with a resist layer, has high dry etching resistance and high heat resistance, and generates a low amount of sublimate. A resist underlayer film-forming composition containing a polymer having a unit structure of the following formula (1):

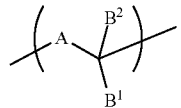

Formula (1)

wherein A is a divalent group having at least two amino groups, the group is derived from a compound having a condensed ring structure and an aromatic group for substituting a hydrogen atom on the condensed ring, and $B^1$ and $B^2$ are each independently a hydrogen atom, an alkyl group, a benzene ring group, a condensed ring group, or a combination thereof, or $B^1$ and $B^2$ optionally form a ring with a carbon atom bonded to $B^1$ and $B^2$.

8 Claims, No Drawings

(56) References Cited

U.S. PATENT DOCUMENTS

2019/0212649 A1    7/2019   Saito et al.
2021/0003920 A1    1/2021   Kori et al.

FOREIGN PATENT DOCUMENTS

| | | |
|---|---|---|
| JP | 2008-501985 A | 1/2008 |
| JP | 2009-173845 A | 8/2009 |
| JP | 2014-029435 A | 2/2014 |
| WO | 2006/132088 A1 | 12/2006 |
| WO | 2008/126804 A1 | 10/2008 |
| WO | 2010/147155 A1 | 12/2010 |
| WO | 2012/077640 A1 | 6/2012 |
| WO | 2013/005797 A1 | 1/2013 |
| WO | 2013/115097 A1 | 8/2013 |

RESIST UNDERLAYER FILM-FORMING COMPOSITION CONTAINING INDOLOCARBAZOLE NOVOLAK RESIN

The present application is a divisional application of U.S. application Ser. No. 15/780,657 filed Jun. 1, 2018, which in turn is a U.S. national stage application of PCT/JP2016/085561 filed Nov. 30, 2016, claiming the priority benefits of Japanese Application No. 2015-235002 filed Dec. 1, 2015. Each of these prior applications is incorporated herein by reference in its entirety.

TECHNICAL FIELD

The present invention relates to a resist underlayer film-forming composition using an indolocarbazole novolak resin.

BACKGROUND ART

Various polymerizations of polymer resins have been investigated. In particular, a polymer including a cyclic structure such as novolak has been widely used from the field of fine processing involved in a photoresist and the like to the field of general processing involved in parts for automobiles and houses. Such a polymer has high heat resistance and is applicable to special applications. Therefore, development of the polymer is presently progressed. As a monomer including a cyclic structure, a structure such as benzene, naphthalene, anthracene, pyrene, and fluorene is generally known. It is known that the monomer forms a novolak with a monomer having an aldehyde group. On the other hand, a carbazole having a structure similar to fluorene has also similar characteristics. It is obvious that a part of a benzene ring adjacent to a five-membered ring in each of the monomer and the carbazole is reacted to obtain a polymer.

Further, in production of a semiconductor device, microprocessing by lithography using a photoresist composition has been conventionally carried out. The microprocessing is a processing method in which a thin film of the photoresist composition is formed on a substrate to be processed such as a silicon wafer, irradiated with active light such as ultraviolet light through a mask pattern on which a pattern of the semiconductor device is formed, and developed, and the substrate to be processed such as a silicon wafer is etched using the obtained photoresist pattern as a protective film. In recent years, an increase in degree of integration of the semiconductor device has advanced, the wavelength of used active light tends to shorten from a KrF excimer laser (248 nm) to an ArF excimer laser (193 nm). Therefore, diffuse reflection of active light on the substrate and effects of standing wave are severe problems. A method for providing an anti-reflective coating between the photoresist and the substrate to be processed has been widely studied.

When formation of finer resist pattern further proceeds, a problem of resolution and a problem in which the resist pattern collapses after development occur. Therefore, a decrease in film thickness of the resist is desired. In this case, it is difficult to obtain a resist pattern film thickness sufficient for substrate processing. A process of imparting a function of a mask during substrate processing to not only the resist pattern but also a resist underlayer film that is formed between the resist and a semiconductor substrate to be processed is required. As such a resist underlayer film for processing, a resist underlayer film for lithography having a selection ratio of dry etching rate close to that of the resist, which is different from a conventional resist underlayer film having high etching rate (in which the etching rate is high), a resist underlayer film for lithography having a lower selection ratio of dry etching rate than that of the resist, and a resist underlayer film for lithography having a lower selection ratio of dry etching rate than that of the semiconductor substrate are required.

Examples of a polymer for the resist underlayer film include as follows.

A resist underlayer film-forming composition using carbazole is exemplified (see Patent Documents 1, 2, 3, and 4).

PRIOR ART DOCUMENTS

Patent Documents

Patent Document 1: International publication WO2010/147155
Patent Document 2: International publication WO2012/077640
Patent Document 3: International publication WO2013/005797
Patent Document 4: International publication WO2014/029435

SUMMARY OF THE INVENTION

Problem to be Solved by the Invention

The present invention provides a resist underlayer film-forming composition used for a lithography process in production of a semiconductor device using an indolocarbazole novolak resin. The present invention provides a resist underlayer film for lithography that does not cause intermixing with a resist layer, has high dry etching resistance and high heat resistance, and generates a low amount of sublimate. Further, the present invention can impart a performance of effectively absorbing reflected light from a substrate during use of irradiated light in microprocessing. The present invention also provides a method for forming a resist pattern using the resist underlayer film-forming composition.

Means for Solving the Problems

A first aspect of the present invention is a resist underlayer film-forming composition containing a polymer having a unit structure of the following formula (1):

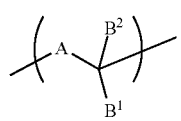

Formula (1)

(wherein A is a divalent group having at least two amino groups, the group is derived from a compound having a condensed ring structure and an aromatic group for substituting a hydrogen atom on the condensed ring, and $B^1$ and $B^2$ are each independently a hydrogen atom, an alkyl group, a benzene ring group, a condensed ring group, or a combination thereof, or $B^1$ and $B^2$ may form a ring with a carbon atom bonded to $B^1$ and $B^2$).

A second aspect of the present invention is the resist underlayer film-forming composition according to the first aspect, wherein A is a divalent group derived from a compound having an indolocarbazole structure.

A third aspect of the present invention is the resist underlayer film-forming composition according to the second aspect, wherein the aromatic group for substituting a hydrogen atom on a condensed ring of the compound having an indolocarbazole structure is a phenyl group.

A fourth aspect of the present invention is the resist underlayer film-forming composition according to the first aspect, wherein A is a divalent group derived from a compound of formula (2):

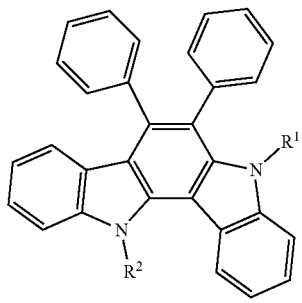

Formula (2)

(wherein $R^1$ and $R^2$ are each independently a hydrogen atom, a $C_{1-10}$ alkyl group, or a $C_{6-40}$ aryl group).

A fifth aspect of the present invention is the resist underlayer film-forming composition according to the fourth aspect, wherein the compound of formula (2) is a product obtained by a reaction of indole with benzil in the presence of an acid compound.

A sixth aspect of the present invention is the resist underlayer film-forming composition according to any one of the first to fifth aspects, further comprising a crosslinker.

A seventh aspect of the present invention is the resist underlayer film-forming composition according to any one of the first to sixth aspects, further comprising an acid and/or an acid generator.

An eighth aspect of the present invention is a method for producing a resist underlayer film obtained by applying the resist underlayer film-forming composition according to any one of the first to seventh aspects to a semiconductor substrate, followed by baking.

A ninth aspect of the present invention is a method for producing a semiconductor device comprising steps of forming a resist underlayer film on a semiconductor substrate from the resist underlayer film-forming composition according to any one of the first to seventh aspects, forming a resist film on the resist underlayer film, irradiating the resist film with light or an electron beam followed by development, to form a resist pattern, etching the resist underlayer film through the formed resist pattern, and processing the semiconductor substrate through the patterned resist underlayer film.

A tenth aspect of the present invention is a method for producing a semiconductor device comprising steps of forming a resist underlayer film on a semiconductor substrate from the resist underlayer film-forming composition according to any one of the first to seventh aspects, forming a hard mask on the resist underlayer film, forming a resist film on the hard mask, irradiating the resist film with light or an electron beam followed by development, to form a resist pattern, etching the hard mask through the formed resist pattern, etching the resist underlayer film through the patterned hard mask, and processing the semiconductor substrate through the patterned resist underlayer film.

An eleventh aspect of the present invention is a polymer having a unit structure of formula (1):

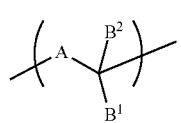

Formula (1)

[wherein A is a divalent group derived from a compound of formula (2):

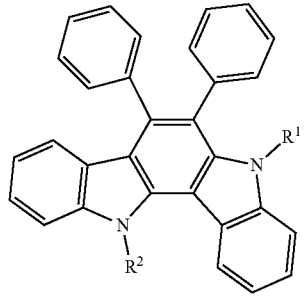

Formula (2)

(wherein $R^1$ and $R^2$ are each independently a hydrogen atom, a $C_{1-10}$ alkyl group, or a $C_{6-40}$ aryl group), and $B^1$ and $B^2$ are each independently a hydrogen atom, an alkyl group, a benzene ring group, a condensed ring group, or a combination thereof, or $B^1$ and $B^2$ may form a ring with a carbon atom bonded to $B^1$ and $B^2$].

Effects of the Invention

According to a resist underlayer film-forming composition for lithography of the present invention, a favorable pattern shape of a resist can be formed without intermixing of an upper layer part of a resist underlayer film with a layer covering the upper layer part.

The resist underlayer film-forming composition of the present invention allows a performance of efficiently suppressing reflection from a substrate to be imparted. Therefore, the resist underlayer film-forming composition of the present invention may also have an effect of an antireflective coating of exposure light.

According to the resist underlayer film-forming composition of the present invention, an excellent resist underlayer film having a selection ratio of dry etching rate close to that of a resist, a selection ratio of dry etching rate lower than that of the resist, and a selection ratio of dry etching rate lower than that of a semiconductor substrate can be provided.

During processing of a substrate using the resist underlayer film of the present invention, a processed substrate (e.g., a thermal silicon oxide film, silicon nitride film, polysilicon film, or the like on the substrate) has sufficient etching resistance.

In order to prevent collapse of a developed resist pattern due to miniaturization of a resist pattern, the film thickness of the resist is decreased. For such a thin film of the resist, there are a process in which the resist pattern is transferred to an underlayer film thereof by an etching process and a substrate is processed using the underlayer film as a mask, and a process in which the resist pattern is transferred to an underlayer film thereof by an etching process, a step of transferring the pattern transferred to the underlayer film to an underlayer film thereof using a different gas composition is repeated, and a substrate is finally processed. The resist underlayer film of the present invention and a composition for forming the resist underlayer film are effective for the processes.

Since the polymer used in the present invention is a polymer having a unit structure having indolocarbazole, the heat resistance is extremely high. In a case where a hard mask is formed on the resist underlayer film formed on the substrate and a resist film is formed on the hard mask in a process for processing a semiconductor substrate and when this hard mask is formed by vacuum vapor deposition of an inorganic substance (e.g., silicon nitride oxide), a vapor-deposited substance is accumulated on a surface of the resist underlayer film. At this time, the temperature of surface of the resist underlayer film increases to about 400° C. Since a resist underlayer film obtained by curing the resist underlayer film-forming composition of the present invention has high heat resistance, thermal deterioration does not occur due to the accumulated vapor-deposited substance. In the resist underlayer film-forming composition of the present invention, the thermal stability is high, as described above, and generation of decomposed substance (sublimate) during baking can be suppressed. Therefore, contamination of a film of upper layer can be prevented, and a margin of temperature can be imparted in a baking step.

Accordingly, the resist underlayer film of the present invention can be used as a flattened film, a resist underlayer film, a film for preventing contamination of a resist layer, or a film having a dry etching selectivity. Thus, a resist pattern can be easily formed with high precision in a lithography process for production of a semiconductor device.

MODES FOR CARRYING OUT THE INVENTION

The present invention relates to a polymer having a unit structure of formula (1), and a resist underlayer film-forming composition containing the polymer having the unit structure of formula (1).

In the present invention, the resist underlayer film-forming composition contains the polymer and a solvent. The resist underlayer film-forming composition may contain a crosslinker and an acid, and if necessary, an additive such as an acid generator and a surfactant. The solid content of the composition is 0.1 to 70% by mass, or 0.1 to 60% by mass. The solid content is a content ratio of all components other than the solvent in the resist underlayer film-forming composition. The solid content may contain the polymer in an amount of 1 to 100% by mass, 1 to 99.9% by mass, or 50 to 99.9% by mass.

The polymer used in the present invention has a weight average molecular weight of 600 to 1,000,000, or 600 to 200,000.

In formula (1), A is a divalent group having at least two amino groups, the group derived from a compound having a condensed ring structure and an aromatic group for substituting a hydrogen atom on the condensed ring, and $B^1$ and $B^2$ are each independently a hydrogen atom, an alkyl group, a benzene ring group, a condensed ring group, or a combination thereof, or may form a ring with a carbon atom bonded to $B^1$ and $B^2$. It is preferable that A be a divalent group having at least two secondary amino groups, the group derived from a compound having a condensed ring structure and an aromatic group for substituting a hydrogen atom on the condensed ring.

In formula (1), A may be a divalent group derived from a compound having an indolocarbazole structure.

Examples of an aromatic group for substituting a hydrogen atom on a condensed ring of the indolocarbazole structure include phenyl group, naphthyl group, anthryl group, and pyrene group. The phenyl group can be preferably used.

In formula (1), a divalent group derived from a compound of formula (2) may be used as A. In this case, the polymer having the unit structure of formula (1) is a novel polymer. The polymer is an excellent component for the resist underlayer film-forming composition of the present invention.

When $R^1$ and $R^2$ are a hydrogen atom, the compound of formula (2) is diphenyl indolocarbazole. Examples of the compound include a derivative of diphenyl indolocarbazole that has a substituent for substituting a hydrogen atom on a nitrogen atom. The diphenyl indolocarbazole can be obtained by a reaction of indole with benzil in an amount of 1 mol relative to 2 mol of indole in the presence of an acid catalyst. As the acid catalyst, an organic sulfonic acid such as methanesulfonic acid, p-toluenesulfonic acid, and p-toluenesulfonic acid monohydrate can be preferably used. Synthesis can be carried out under a reflux using a hydrocarbon solvent such as toluene at a temperature of about 140 to 180° C. for 50 to 20 hours.

In formula (2), $R^1$ and $R^2$ may be each independently a hydrogen atom, a $C_{1-10}$ alkyl group, or a $C_{6-40}$ aryl group. In particular, a hydrogen atom may be adopted.

Examples of the $C_{1-10}$ alkyl group include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Examples of the $C_{6-40}$ aryl group include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-naphthyl group, o-biphenyl group, m-biphenyl group, p-biphenyl group, 1-anthryl group, 2-anthryl group, 9-anthryl group, 1-phenanthryl group, 2-phenanthryl group, 3-phenanthryl group, 4-phenanthryl group, 9-phenanthryl group, and pyrene group.

In the unit structure of formula (1), $B^1$ and $B^2$ are each independently a hydrogen atom, an alkyl group, a benzene ring group, a condensed ring group, or a combination thereof, or $B^1$ and $B^2$ may form a ring with a carbon atom bonded to $B^1$ and $B^2$. The combination thereof herein means a group including a combination of an alkyl group and a benzene ring group or a condensed ring group. For example, the group may be a benzyl group, a methyl anthracene group, or the like.

$B^1$ and $B^2$ are each a group derived from an aldehyde or a ketone having a hydrogen atom, an alkyl group, a benzene ring group, or a condensed ring group, which is a material in production of the polymer having the unit structure of formula (1). $B^1$ and $B^2$ form a novolak resin with a compound providing a moiety corresponding to A.

The alkyl group is the $C_{1-10}$ alkyl group described above. The condensed ring group is a condensed ring group corresponding to the $C_{10-40}$ aryl group described above. Examples thereof include naphthyl group, anthryl group, pyrene group, and derivatives thereof.

When $B^1$ and $B^2$ are a hydrogen atom, examples of the aldehyde as a material providing the groups of $B^1$ and $B^2$ in formula (1) include formaldehyde. When $B^1$ is a hydrogen atom and $B^2$ is an alkyl group, examples of the aldehyde include acetaldehyde, ethylaldehyde, and isobutylaldehyde. When $B^1$ is a hydrogen atom and $B^2$ is a benzene ring group, examples of the aldehyde include benzaldehyde. When $B^1$ is a hydrogen atom and $B^2$ is a condensed ring group, examples of the aldehyde include naphthyladlehyde, anthrylaldehyde, and pyrenecarboxyaldehyde. When $B^1$ is a hydrogen atom and $B^2$ is a combination of an alkyl group and a benzene ring, examples of the aldehyde include phenylacetaldehyde.

A case where $B^1$ and $B^2$ form a ring with a carbon atom bonded to $B^1$ and $B^2$ corresponds a case of using a ketone in production of the polymer having the unit structure of formula (1). The ketone is diaryl ketone or alkylaryl ketone. Examples thereof include diphenyl ketone, phenyl naphthyl ketone, dinaphtyl ketone, phenyl tolyl ketone, ditolyl ketone, 9-fluorenone, and methylphenyl ketone.

As the acid catalyst used in a condensation reaction in production of the polymer having the unit structure of formula (1), for example, a mineral acid such as sulfuric acid, phosphoric acid, and perchloric acid, an organic sulfonic acid such as methanesulfonic acid, p-toluenesulfonic acid, and p-toluenesulfonic acid monohydrate, or a carboxylic acid such as formic acid and oxalic acid is used. The amount of acid catalyst to be used is variously selected depending on the kind of used acid. The amount is usually 0.001 to 10,000 parts by mass, preferably 0.01 to 1,000 parts by mass, and more preferably 0.1 to 100 parts by mass, relative to 100 parts by mass of a compound providing a moiety corresponding to A of formula (1).

The condensation reaction can be carried out without a solvent, but the concentration reaction is usually carried out using a solvent. Any solvent can be used as long as it does not inhibit the reaction. Examples thereof include cyclic ethers such as tetrahydrofuran and dioxane, propylene glycol monomethyl ether, and propylene glycol monomethyl ether acetate. When the used acid catalyst is, for example, a liquid like formic acid, it can also act as the solvent.

The reaction temperature in the condensation is usually 40° C. to 200° C. The reaction time is variously selected depending on the reaction temperature, and is usually about 30 minutes to about 50 hours.

The weight average molecular weight Mw of the polymer obtained as described above is usually 600 to 1,000,000 or 600 to 200,000.

Examples of the unit structure of formula (1) include as follows.

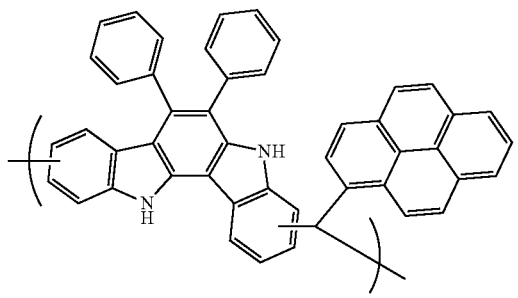

Formula (1-1)

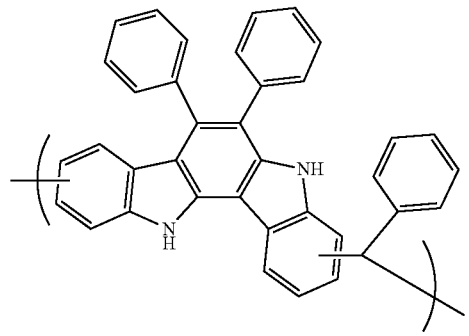

Formula (1-2)

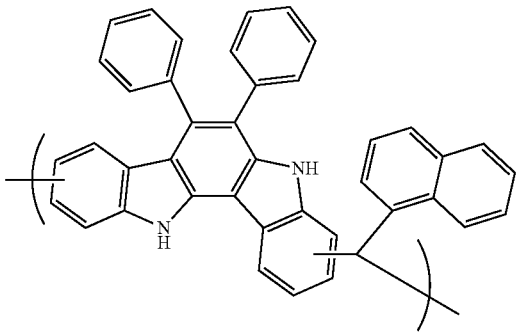

Formula (1-3)

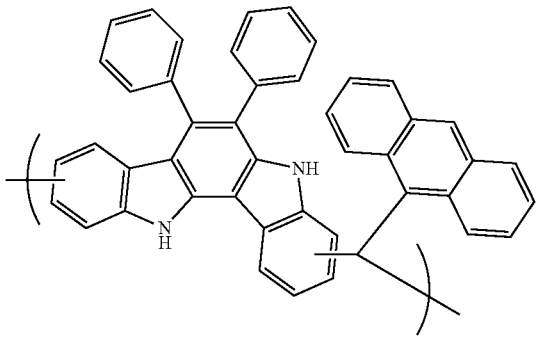

Formula (1-4)

-continued

Formula (1-5)

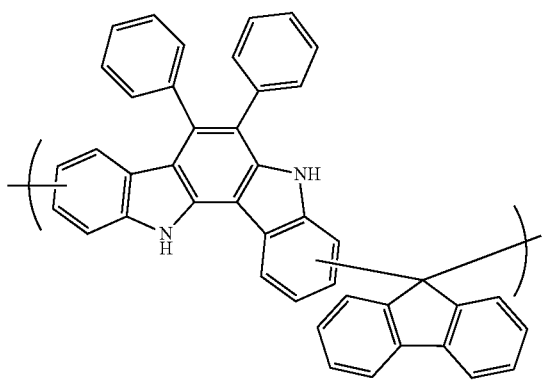

The polymer can be mixed with another polymer in an amount of 30% by mass or less relative to the total polymer and used.

Examples of the other polymer include a polyacrylate compound, a polymethacrylate compound, a polyacrylamide compound, a polymethacrylamide compound, a polyvinyl compound, a polystyrene compound, a polymaleimide compound, a polymaleic acid anhydride, and a polyacrylonitrile compound.

The resist underlayer film-forming composition of the present invention may contain a crosslinker component. Examples of the crosslinker include a melamine-based crosslinker, a substituted urea-based crosslinker, and melamine- and substituted urea-polymer-based crosslinkers. A crosslinker having at least two crosslinking-forming substituents is preferable. Examples thereof include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and butoxymethylated thiourea. A condensate of the compounds may be also used.

As the crosslinker, a crosslinker having high heat resistance can be used. As the crosslinker having high heat resistance, a compound containing a crosslinking-forming substituent having an aromatic ring group (e.g., benzene ring and naphthalene ring) in the molecule may be preferably used.

Examples of the compound include a compound having a partial structure of the following formula (3) and a polymer and an oligomer having a repeating unit of the following formula (4).

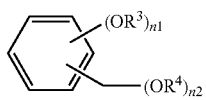

Formula (3)

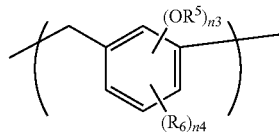

Formula (4)

In formula (3), $R^3$ and $R^4$ are each independently a hydrogen atom, a $C_{1-10}$ alkyl group, or a $C_{6-20}$ aryl group, n1 is an integer of 1 to 4, n2 is an integer of 1 to (5−n1), and (n1+n2) is an integer of 2 to 5.

In formula (4), $R^5$ is a hydrogen atom or a $C_{1-10}$ alkyl group, $R^6$ is a $C_{1-10}$ alkyl group, n3 is an integer of 1 to 4, n4 is an integer of 0 to (4−n3), and (n3+n4) is an integer of 1 to 4. The oligomer and the polymer in which the number of repeating unit structures falls within a range of 2 to 100 or 2 to 50 may be used.

The alkyl group and the aryl group can be exemplified by the above-described alkyl groups and aryl groups.

Examples of the compound of formula (3) and the polymer and oligomer of formula (4) include as follows.

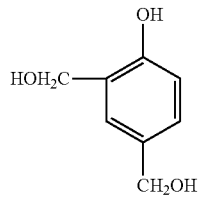

Formula (4-1)

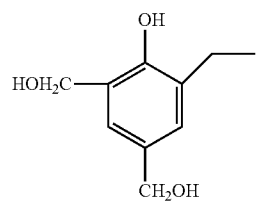

Formula (4-2)

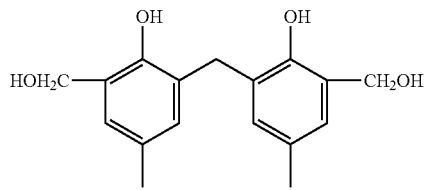

Formula (4-3)

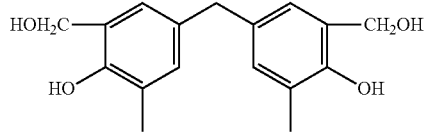

Formula (4-4)

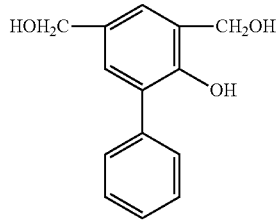

Formula (4-5)

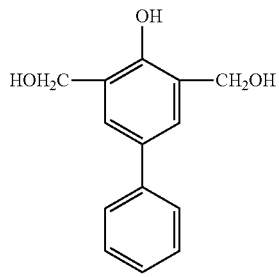

Formula (4-6)

Formula (4-7)
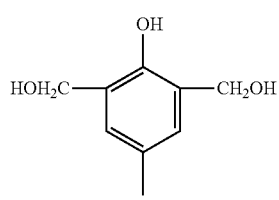
Formula (4-8)
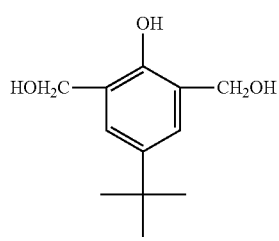
Formula (4-9)
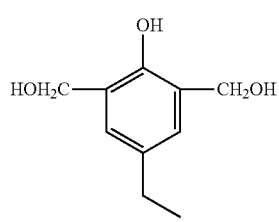
Formula (4-10)
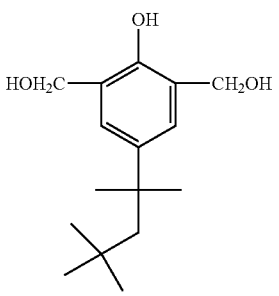
Formula (4-11)
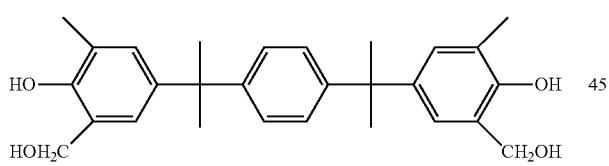
Formula (4-12)
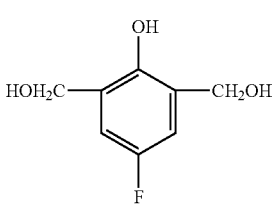
Formula (4-13)
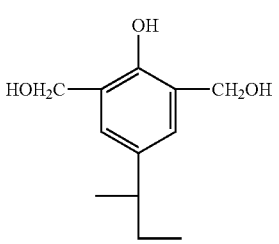
Formula (4-14)
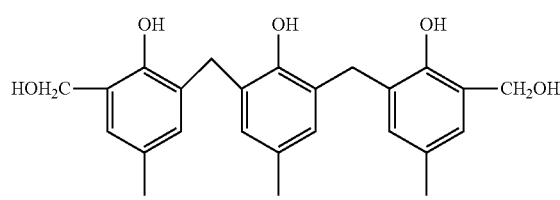
Formula (4-15)
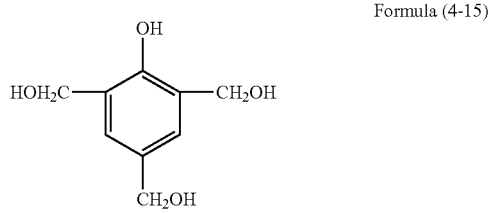
Formula (4-16)
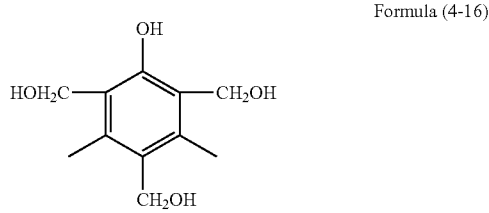
Formula (4-17)
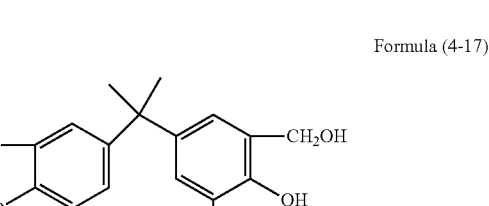
Formula (4-18)
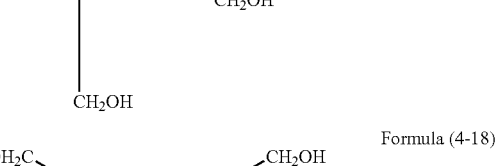
Formula (4-19)
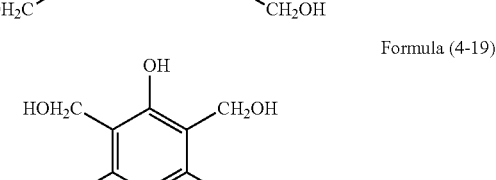
Formula (4-20)
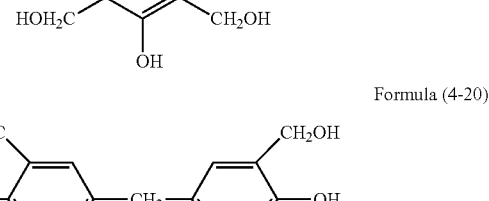
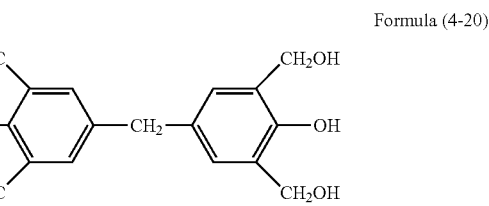

-continued

Formula (4-21)
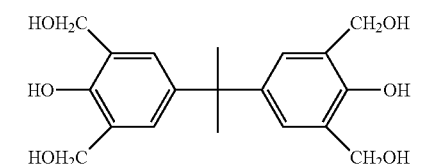

Formula (4-22)
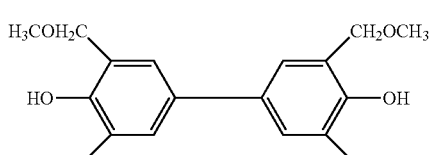

Formula (4-23)
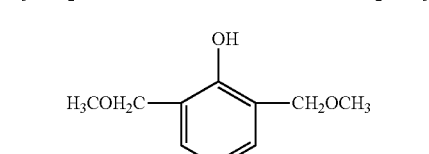

Formula (4-24)
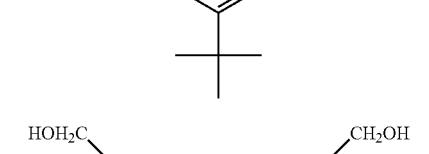

Formula (4-25)
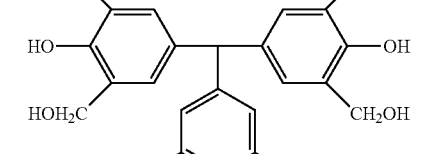

Formula (4-26)
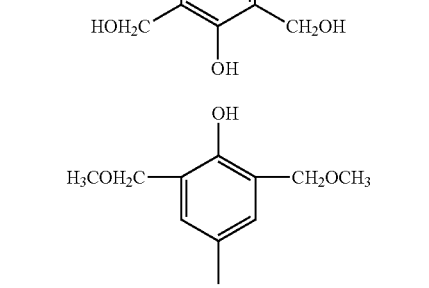

Formula (4-27)
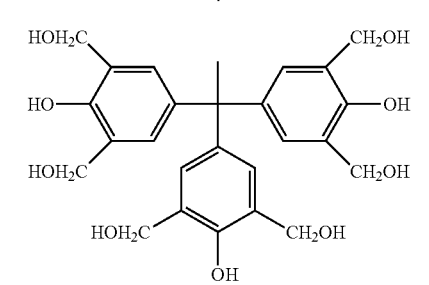

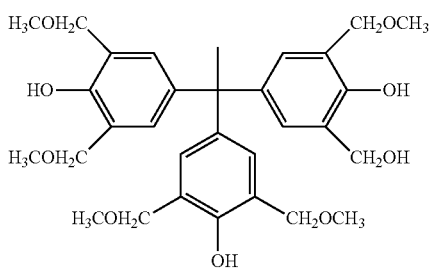

The compounds described above are available as products available from Asahi Organic Chemicals Industry Co., Ltd., and Honshu Chemical Industry Co., Ltd. Among the compounds, for example, the compound of formula (4-21) is available as trade name TM-BIP-A available from Asahi Organic Chemicals Industry Co., Ltd.

The amount of crosslinker to be added varies depending on a coating solvent to be used, an underlying substrate to be used, a solution viscosity to be required, and a film form to be required. The amount is 0.001 to 80% by mass, preferably 0.01 to 50% by mass, and further preferably 0.05 to 40% by mass, relative to the total solid content. The crosslinker may cause a cross-linking reaction due to self-condensation. However, when the polymer in the present invention has a crosslinkable substituent, the crosslinker may cause a cross-linking reaction with the crosslinkable substituent.

In the present invention, as a catalyst for promoting the cross-linking reaction, an acidic compound such as p-toluenesulfonic acid, trifluoromethanesulfonic acid, pyridinium p-toluenesulfonic acid, salicylic acid, sulfosalicylic acid, citric acid benzoic acid, hydroxybenzoic acid, and naphthalenecarboxylic acid, and/or a thermal acid generator such as 2,4,4,6-tetrabromocyclohexadienone, benzoin tosylate, 2-nitrobenzyl tosylate, and another organic alkyl sulfonate can be mixed. The amount of catalyst to be mixed is 0.0001 to 20% by mass, preferably 0.0005 to 10% by mass, and further preferably 0.01 to 3% by mass, relative to the total solid content.

A coating underlayer film-forming composition for lithography of the present invention may contain a photoacid generator so that the acidity thereof coincides with that of a photoresist covering an upper layer in a lithography step. Preferable examples of the photoacid generator include onium salt-based photoacid generators such as bis(4-tert-butylphenyl)iodonium trifluoromethanesulfonate and triphenylsulfonium trifluoromethanesulfonate, halogen-containing compound-based photoacid generators such as phenyl-bis(trichloromethyl)-s-triazine, and sulfonic acid compound-based photoacid generators such as benzoin tosylate, and N-hydroxysuccinimide trifluoromethanesulfonate. The amount of the photoacid generator is 0.2 to 10% by mass, and preferably 0.4 to 5% by mass, relative to the total solid content.

In addition, the resist underlayer film-forming composition for lithography of the present invention can contain a light absorber, a rheology modifier, an adhesive adjuvant, a surfactant, or the like, if necessary.

As the light absorber, a commercially available light absorber described in "Kogyoyoshikiso no gijutsu to shijo" (CMC Publishing Co., Ltd.) or "Senryo binran" (edited by The Society of Synthetic Organic Chemistry, Japan.), for example, C. I. Disperse Yellow 1, 3, 4, 5, 7, 8, 13, 23, 31, 49, 50, 51, 54, 60, 64, 66, 68, 79, 82, 88, 90, 93, 102, 114, or 124; C. I. Disperse Orange 1, 5, 13, 25, 29, 30, 31, 44, 57, 72, or 73; C. I. Disperse Red 1, 5, 7, 13, 17, 19, 43, 50, 54, 58, 65, 72, 73, 88, 117, 137, 143, 199, or 210; C. I. Disperse Violet 43; C. I. Disperse Blue 96; C. I. Fluorescent Brightening Agent 112, 135, or 163; C. I. Solvent Orange 2 or 45; C. I. Solvent Red 1, 3, 8, 23, 24, 25, 27, or 49; C. I. Pigment Green 10; C. I. Pigment Brown 2; or the like, can be suitably used. The light absorber is usually mixed in an amount of 10% by mass or less, and preferably 5% by mass or less, relative to the total solid content of the resist underlayer film-forming composition for lithography.

The rheology modifier is added to mainly improve the flowability of the resist underlayer film-forming composition, and in particular, to improve the film thickness uniformity of a resist underlayer film and enhance the packing properties of the inside of holes with the resist underlayer film-forming composition in a baking step. Specific examples thereof include phthalic acid derivatives such as dimethyl phthalate, diethyl phthalate, diisobutyl phthalate, dihexyl phthalate, and butylisodecyl phthalate, adipic acid derivatives such as di-n-butyl adipate, diisobutyl adipate, diisooctyl adipate, and octyldecyl adipate, maleic acid derivatives such as di-n-butyl maleate, diethyl maleate, and dinonyl maleate, oleic acid derivatives such as methyl oleate, butyl oleate, and tetrahydrofurfuryl oleate, and stearic acid derivatives such as n-butyl stearate and glyceryl stearate. The rheology modifier is usually mixed in an amount of less than 30% by mass relative to the total solid content of the resist underlayer film-forming composition for lithography.

The adhesive adjuvant is added to mainly improve the adhesion of a substrate or a resist to the resist underlayer film-forming composition, and in particular, to prevent peeling of the resist in development. Specific examples thereof include chlorosilanes such as trimethylchlorosilane, dimethylvinylchlorosilane, methyl diphenylchlorosilane, and chloromethyldimethylchlorosilane, alkoxysilanes such as trimethylmethoxysilane, dimethyldiethoxysilane, methyldimethoxysilane, dimethylvinylethoxysilane, diphenyldimethoxysilane, and phenyltriethoxysilane, silazanes such as hexamethyldisilazane, N,N'-bis(trimethylsilyl)urea, dimethyltrimethylsilylamine, and trimethylsilyl imidazole, silanes such as vinyltrichlorosilane, γ-chloropropyltrimethoxysilane, γ-aminopropyltriethoxysilane, and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine, and a urea or thiourea compound such as 1,1-dimethylurea and 1,3-dimethylurea. The adhesive adjuvant is usually mixed in an amount of less than 5% by mass, and preferably less than 2% by mass, relative to the total solid content of the resist underlayer film-forming composition for lithography.

In the resist underlayer film-forming composition for lithography of the present invention, a surfactant can be mixed to further improve the coating properties against unevenness of a surface without generating pinholes, striation, and the like. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including Eftop EF301, EF303, and EF352 (trade name, available from Tohkem Products Corporation), MEGAFACE F171, F173, R-30, R-40, and R-40N (trade name, available from DIC Corporation), Fluorad FC430 and FC431 (trade name, available from Sumitomo 3M, Ltd.), and AsahiGuard AG710 and Surflon S-382, SC101, SC102, SC103, SC104, SC105, and SC106 (trade name, available from Asahi Glass Co., Ltd.), and organosiloxane polymer KP341 (available from Shin-Etsu Chemical Co., Ltd.). The amount of surfactant to be mixed is usually 2.0% by mass or less, and preferably 1.0% by mass or less, relative to the total solid content of the resist underlayer film-forming composition for lithography of the present invention. The surfactant may be added alone, or two or more kinds thereof may be added in combination.

In the present invention, as a solvent capable of dissolving the polymer, the crosslinker component, the crosslinking catalyst, and the like, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, or the like can be used. The organic solvent can be used alone, or two or more kinds thereof can be used in combination.

Further, a mixture of solvents having a high boiling point such as propylene glycol monobutyl ether and propylene glycol monobutyl ether acetate can be used. Among the solvents, propylene glycol monomethyl ether, propylene glycol monomethyl ether acetate, ethyl lactate, butyl lactate, and cyclohexanone are preferable in terms of improved leveling properties.

Next, a method for forming a resist pattern of the present invention will be described. The resist underlayer film-forming composition of the present invention is applied to a substrate used in production of a precision integrated circuit element (e.g., a transparent substrate such as a silicon/silicon dioxide coating, a glass substrate, and an ITO substrate) by an appropriate coating means such as a spinner or a coater, baked, and cured to form a coating underlayer film. The thickness of the resist underlayer film is preferably 0.01 to 3.0 μm. A baking condition after coating is at 80 to 350° C. for 0.5 to 120 minutes. After then, a resist is applied directly to the resist underlayer film, or if necessary, a resist is applied after one or more layers of coating material are formed on the coating underlayer film. The resist is irradiated with light or an electron beam through a predetermined mask, developed, washed, and dried. Thus, a favorable resist pattern can be obtained. If necessary, post exposure bake (PEB) can be also carried out after the irradiation with light or an electron beam. The resist underlayer film at a portion where the resist is developed and removed in the step described above can be removed by dry etching, to form a desired pattern on the substrate.

The resist used in the present invention is a photoresist or an electron beam resist.

As a photoresist applied to an upper part of a resist underlayer film for lithography in the present invention, any of a negative photoresist and a positive photoresist can be used. Examples thereof may include a positive photoresist including a novolak resin and 1,2-naphthoquinone diazide sulfonic acid ester; a chemically amplified photoresist including a binder having a group that increases an alkali dissolution rate by decomposition with an acid and a photoacid generator; a chemically amplified photoresist including an alkaline soluble binder, a low molecular compound that increases the alkali dissolution rate of the photoresist by decomposition with an acid, and a photoacid generator; a chemically amplified photoresist including a binder having a group that increases the alkali dissolution rate by decomposition with an acid, a low molecular compound that increases the alkali dissolution rate of the photoresist by decomposition with an acid, and a photoacid generator; and a photoresist having a Si atom in the skeleton. Specific examples thereof include trade name APEX-E available from Rohm and Haas.

Examples of an electron beam resist applied to the upper part of the resist underlayer film for lithography in the present invention include a composition including a resin having a Si—Si bond in the main chain and an aromatic ring at the terminal and an acid generator that generates an acid by irradiation with an electron beam; and a composition including poly(p-hydroxyl styrene) of which a hydroxyl group is substituted by an organic group containing N-carboxyamine and an acid generator that generates an acid by irradiation with an electron beam. In the latter electron beam resist composition, an acid generated from the acid generator by irradiation with an electron beam is reacted with an N-carboxyaminoxy group of a polymer side chain to decompose the polymer side chain into a hydroxyl group. Thus, the electron beam resist composition exhibits alkaline solubility, and is dissolved in an alkaline developer to form a resist pattern. Examples of the acid generator that generates an acid by irradiation with an electron beam include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine, onium salts such as a triphenyl sulfonium salt and a diphenyliodonium salt, and sulfonate esters such as nitrobenzyl tosylate and dinitrobenzyl tosylate.

A resist solution is applied and baked at a baking temperature of 70 to 150° C. for a baking time of 0.5 to 5 minutes, to obtain a resist film having a thickness of 10 to 1,000 nm. The resist solution, the developer, and a coating material described below can be applied by a spin coating method, a dipping method, a spraying method, or the like. In particular, a spin coating method is preferable. Exposure of the resist is carried out through a predetermined mask. For the exposure, a KrF excimer laser (wavelength: 248 nm), an ArF excimer laser (wavelength: 193 nm), EUV light (wavelength: 13.5 nm), an electron beam, or the like, can be used. After the exposure, post exposure bake (PEB) can be carried out, if necessary. In the post exposure bake, a heating temperature and a heating time are appropriately selected from 70° C. to 150° C. and 0.3 to 10 minutes, respectively.

As a developer of the resist having the resist underlayer film formed from the resist underlayer film-forming composition for lithography of the present invention, an aqueous solution of an alkali including an inorganic alkali such as sodium hydroxide, potassium hydroxide, sodium carbonate, sodium silicate, sodium metasilicate, and aqueous ammonia, a primary amine such as ethylamine and n-propylamine, a secondary amine such as diethylamine and di-n-butylamine, a tertiary amine such as triethylamine and methyldiethylamine, an alcoholamine such as dimethylethanolamine and triethanolamine, a quaternary ammonium salt such as tetramethylammonium hydroxide, tetraethylammonium hydroxide, and choline, or a cyclic amine such as pyrrole and piperidine can be used. A solution in which proper amounts of an alcohol such as isopropyl alcohol and a surfactant such as a nonionic surfactant are added to the aqueous solution of the alkali can be also used. Among the developers, a quaternary ammonium salt is preferable, and tetramethylammonium hydroxide and choline are further preferable.

In the present invention, an organic solvent can be used as a developer in development of the resist. After exposure of the resist, development is carried out by using the developer (solvent). For example, when the positive photoresist is used, the photoresist at an unexposed part is removed to form a pattern of the photoresist.

Examples of the developer include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. Further, a surfactant or the like can be added to the developer. A development condition is appropriately selected from a temperature of 5 to 50° C. and a time of 10 to 600 seconds.

In the present invention, a semiconductor device can be produced by steps of forming a resist underlayer film on a semiconductor substrate from the resist underlayer film-forming composition of the present invention, forming a resist film on the resist underlayer film, irradiating the resist film with light or an electron beam followed by development, to form a resist pattern, etching the resist underlayer film through the formed resist pattern, and processing the semiconductor substrate through the patterned resist underlayer film.

When formation of finer resist pattern further proceeds, a problem of resolution and a problem in which the resist pattern collapses after development occur. Therefore, a decrease in film thickness of the resist is desired. In this case, it is difficult to obtain a resist pattern film thickness sufficient for substrate processing. A process of imparting a function of a mask during substrate processing to not only the resist pattern but also the resist underlayer film that is formed between the resist and the semiconductor substrate to be processed is required. As a resist underlayer film for such a process, a resist underlayer film for lithography having a selection ratio of dry etching rate close to that of the resist, which is different from a conventional resist underlayer film having a high etching rate, a resist underlayer film for lithography having a smaller selection ratio of dry etching rate than that of the resist, and a resist underlayer film for lithography having a smaller selection ratio of dry etching rate than that of the semiconductor substrate are required. To such a resist underlayer film, an anti-reflective performance may be imparted, and the resist underlayer film may have a function of a conventional anti-reflective coating.

On the other hand, in order to obtain a finer resist pattern, a process of making the resist pattern and the resist underlayer film finer by dry etching of the resist underlayer film than the pattern width in resist development began to be also used. A resist underlayer film having a selection ratio of dry etching close to that of the resist, which is different from the conventional anti-reflective coating having a high etching rate, is required as the resist underlayer film for such a process. To such a resist underlayer film, an anti-reflective performance may be imparted, and the resist underlayer film may have the function of the conventional anti-reflective coating.

In the present invention, the resist underlayer film of the present invention is formed on the substrate, and the resist may be applied directly to the resist underlayer film, or if necessary, the resist may be applied after one or more layers of coating material are formed on the resist underlayer film. In this case, even when the resist is thinly applied to prevent pattern collapse due to a decrease in pattern width of the resist, the substrate can be processed by selection of appropriate etching gas.

Specifically, the semiconductor device can be produced by steps of forming a resist underlayer film on a semiconductor substrate from the resist underlayer film-forming composition of the present invention, forming a hard mask from a coating material containing a silicon component or the like or a hard mask (e.g., from silicon nitride oxide) by vapor deposition on the resist underlayer film, forming a resist film on the hard mask, irradiating the resist film with light or an electron beam followed by development, to form a resist pattern, etching the hard mask through the resist pattern by a halogen-based gas, etching the resist underlayer film through the patterned hard mask by an oxygen-based gas or a hydrogen-based gas, and processing the semiconductor substrate through the patterned resist underlayer film by a halogen-based gas.

In a process in which the resist underlayer film is formed on a substrate, a hard mask is formed on the resist underlayer film, a resist film is formed on the hard mask, a resist pattern is formed by exposure and development, the resist pattern is transferred to the hard mask, the resist pattern transferred to the hard mask is transferred to the resist underlayer film, and the semiconductor substrate is processed using the resist underlayer film, as described above, the hard mask may be formed from a coating composition containing an organic polymer or an inorganic polymer and a solvent, or the hard mask may be formed by vacuum vapor deposition of an inorganic substance. In the vacuum vapor deposition of an inorganic substance (e.g., silicon nitride oxide), a deposition substance is accumulated on the surface of the resist underlayer film, and at this time, the surface temperature of the resist underlayer film increases to about 400° C. Since the polymer used for the resist underlayer film-forming composition of the present invention is the polymer having a unit structure containing indolocarbazole, the heat resistance is very high, and thermal degenerate does not occur even due to accumulated deposition substance.

The resist underlayer film-forming composition for lithography of the present invention has high thermal stability, and can prevent contamination of a film of upper layer by a decomposed substance during baking, and impart a margin of temperature in a baking step.

In consideration of effects of the anti-reflective coating, a light absorption moiety is incorporated in the skeleton in the resist underlayer film-forming composition for lithography of the present invention and a substance is therefore not diffused in the photoresist during heating and drying, and the light absorption moiety has sufficiently high light absorption performance. Accordingly, the resist underlayer film-forming composition has a high anti-reflective effect.

Further, the resist underlayer film-forming composition for lithography of the present invention can be used for a film having a function of preventing reflection of light depending on a process condition, and a function of preventing an interaction between the substrate and the photoresist or an adverse influence on the substrate of a substance produced during exposure to a material used for the photoresist or the photoresist.

EXAMPLES

Synthesis Example 1 of Raw Material

In a 1-L three-neck flask, 30.00 g of benzil (available from Tokyo Chemical Industry Co., Ltd.), 41.79 g of indole (available from Tokyo Chemical Industry Co., Ltd.), 5.43 g of p-toluenesulfonic acid monohydrate (available from Tokyo Chemical Industry Co., Ltd.), and 300 g of toluene (available from KANTO CHEMICAL CO., INC.) were placed. Subsequently, a reflux condenser was attached, and the mixture was stirred under reflux in a nitrogen atmosphere at 160° C. for about 12 hours. After completion of the reaction, a precipitate was collected by suction filtration, and washed with 1 L of toluene and 1 L of methanol. The precipitate was dried under vacuum at 60° C. for about 12 hours.

In a 1-L three-neck flask, the dried precipitate and 500 mL of 1,4-dioxane were placed. Subsequently, a reflux condenser was attached, and the mixture was stirred under reflux in a nitrogen atmosphere at 120° C. for about 1 hour. The stirring was terminated, and the mixture was cooled to cause recrystallization. The recrystallized compound was collected by suction filtration, and washed with 1 L of 1,4-dioxane and 1 L of hexane. The precipitate was dried under vacuum at 60° C. for about 12 hours, to obtain 17.7 g of compound 1 of formula (2-1) with a purity of 99.1% at a yield of 24.6%.

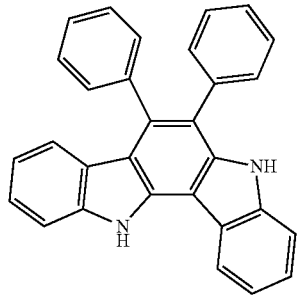

Formula (2-1)

Synthesis Example 1

In a three-neck flask, 5.00 g of the compound 1, 2.84 g of 1-pyrenecarboxyaldehyde (available from Aldrich), 19.12 g of propylene glycol monomethyl ether acetate, and 0.35 g of methanesulfonic acid (available from Tokyo Chemical Industry Co., Ltd.) were placed. The mixture was then heated to 150° C., and stirred under reflux for about 36 hours. After completion of the reaction, the mixture was diluted with 24.80 g of propylene glycol monomethyl ether acetate, and the precipitate was removed by filtration. The collected filtrate was added dropwise to a methanol solution, resulting in reprecipitation. The obtained precipitate was filtered by suction, and the filtered product was dried at 60° C. overnight under reduced pressure. As a result, 2.51 g of resin was obtained as a black powder. The resulting polymer corresponded to formula (1-1). The weight average molecular weight Mw measured by GPC in terms of polystyrene was 5,900 and the polydispersity index Mw/Mn was 2.19.

Synthesis Example 2

In a two-neck flask, 8.00 g of the compound 1, 2.08 g of benzaldehyde (available from KISHIDA CHEMICAL Co., Ltd.), 28.39 g of propylene glycol monomethyl ether acetate, 7.10 g of N-methyl-2-pyrrolidinone (available from KANTO CHEMICAL CO., INC.), and 1.13 g of methanesulfonic acid (available from Tokyo Chemical Industry Co., Ltd.) were placed. The mixture was then heated to 150° C., and stirred under reflux for about 20 hours. After completion of the reaction, the mixture was diluted with 20.49 g of propylene glycol monomethyl ether acetate, and the precipitate was removed by filtration. The collected filtrate was added dropwise to a methanol solution, resulting in reprecipitation. The obtained precipitate was filtered by suction, and the filtered product was dried at 60° C. overnight under reduced pressure. As a result, 6.42 g of resin was obtained as a gray powder. The resulting polymer corresponded to formula (1-2). The weight average molecular weight Mw measured by GPC in terms of polystyrene was 16,100 and the polydispersity index Mw/Mn was 3.12.

Synthesis Example 3

In a two-neck flask, 8.00 g of the compound 1, 3.06 g of 1-naphthaldehyde (available from Tokyo Chemical Industry Co., Ltd.), 32.83 g of propylene glycol monomethyl ether acetate, 8.21 g of N-methyl-2-pyrrolidinone (available from KANTO CHEMICAL CO., INC.), and 2.26 g of methanesulfonic acid (available from Tokyo Chemical Industry Co., Ltd.) were placed. The mixture was then heated to 150° C., and stirred under reflux for about 20 hours. After completion of the reaction, the mixture was diluted with 19.37 g of propylene glycol monomethyl ether acetate, and the precipitate was removed by filtration. The collected filtrate was added dropwise to a methanol solution, resulting in reprecipitation. The obtained precipitate was filtered by suction, and the filtered product was dried at 60° C. overnight under reduced pressure. As a result, 6.58 g of resin was obtained as a gray powder. The resulting polymer corresponded to formula (1-3). The weight average molecular weight Mw measured by GPC in terms of polystyrene was 7,500 and the polydispersity index Mw/Mn was 2.02.

Synthesis Example 4

In a two-neck flask, 9.00 g of the compound 1, 3.97 g of 9-fluorenone (available from Tokyo Chemical Industry Co., Ltd.), 10.56 g of propylene glycol monomethyl ether acetate, 4.53 g of N-methyl-2-pyrrolidinone (available from KANTO CHEMICAL CO., INC.), and 2.12 g of methanesulfonic acid (available from Tokyo Chemical Industry Co., Ltd.) were placed. The mixture was then heated to 150° C., and stirred under reflux for about 63 hours. After completion of the reaction, the mixture was diluted with 34.68 g of propylene glycol monomethyl ether acetate, and the precipitate was removed by filtration. The collected filtrate was added dropwise to a methanol solution, resulting in reprecipitation. The obtained precipitate was filtered by suction, and the filtered product was dried at 60° C. overnight under reduced pressure. As a result, 5.45 g of resin was obtained as a gray powder. The resulting polymer corresponded to formula (1-5). The weight average molecular weight Mw measured by GPC in terms of polystyrene was 3,100 and the polydispersity index Mw/Mn was 1.51.

Comparative Synthesis Example 1

In a 500-mL eggplant-shaped flask, 30.00 g of carbazole (available from Tokyo Chemical Industry Co., Ltd.), 41.68 g of 1-pyrenecarboxyaldehyde (available from Aldrich), 117.76 g of propylene glycol monomethyl ether acetate, and 6.83 g of p-toluenesulfonic acid monohydrate (available from Tokyo Chemical Industry Co., Ltd.) were placed. The mixture was then heated to 150° C., and stirred under reflux for about 1 hour. After completion of the reaction, the mixture was diluted with 520.49 g of propylene glycol monomethyl ether acetate, and the precipitate was removed by filtration. The collected filtrate was added dropwise to a methanol solution, resulting in reprecipitation. The obtained precipitate was filtered by suction, and the filtered product was dried at 60° C. overnight under reduced pressure. As a result, 71.6 g of carbazole resin was obtained as a blue powder. The resulting polymer corresponded to formula (5-1). The weight average molecular weight Mw measured by GPC in terms of polystyrene was 2,600 and the polydispersity index Mw/Mn was 1.62.

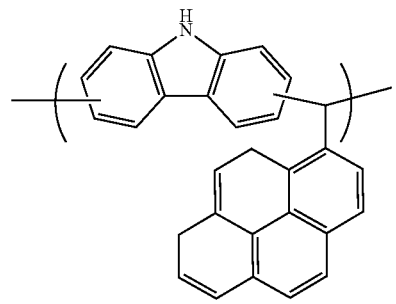

Formula (5-1)

Example 1

In 1.0 g of the resin (formula (1-1)) obtained in Synthesis Example 1, 0.001 g of MEGAFACE R-30N was mixed as a surfactant. The mixture was dissolved in 1.10 g of propylene glycol monomethyl ether acetate and 8.14 g of cyclohexanone and filtered to prepare a solution of resist underlayer film-forming composition used in a lithography process through a multilayer film.

Example 2

In 1.0 g of the resin (formula (1-2)) obtained in Synthesis Example 2, 0.001 g of MEGAFACE R-30N was mixed as a surfactant. The mixture was dissolved in 1.10 g of propylene glycol monomethyl ether acetate and 8.14 g of cyclohexanone and filtered to prepare a solution of resist underlayer film-forming composition used in a lithography process through a multilayer film.

Example 3

In 1.0 g of the resin (formula (1-3)) obtained in Synthesis Example 3, 0.001 g of MEGAFACE R-30N was mixed as a surfactant. The mixture was dissolved in 1.10 g of propylene glycol monomethyl ether acetate and 8.14 g of cyclohexanone and filtered to prepare a solution of resist underlayer film-forming composition used in a lithography process through a multilayer film.

Example 4

In 1.0 g of the resin (formula (1-5)) obtained in Synthesis Example 4, 0.001 g of MEGAFACE R-30N was mixed as a surfactant. The mixture was dissolved in 1.10 g of propylene glycol monomethyl ether acetate and 8.14 g of cyclohexanone and filtered to prepare a solution of resist underlayer film-forming composition used in a lithography process through a multilayer film.

Comparative Example 1

In 1.0 g of the resin (formula (5-1)) obtained in Comparative Synthesis Example 1, 0.001 g of MEGAFACE R-30N was mixed as a surfactant. The mixture was dissolved in 1.10 g of propylene glycol monomethyl ether acetate and 8.14 g of cyclohexanone and filtered to prepare a solution of resist underlayer film-forming composition used in a lithography process through a multilayer film.

(Elution Test into Resist Solvent)

The solutions of the resist underlayer film-forming compositions prepared in Examples 1 to 4 and Comparative Example 1 were each applied to a silicon wafer using a spin coater, baked on a hot plate at 240° C. for 1 minute, and then baked at 400° C. for 1 minute, to form a resist underlayer film (thickness: 0.08 µm). The resist underlayer film was immersed in ethyl lactate, propylene glycol monomethyl ether, propylene glycol monomethyl ether acetate, and cyclohexanone, which were a solvent used for a resist. The resist underlayer films were insoluble in the solvents.

(Measurement of Optical Constant)

The solutions of the resist underlayer film-forming compositions prepared in Examples 1 to 4 and Comparative Example 1 were each applied to a silicon wafer using a spin coater, baked on a hot plate at 240° C. for 1 minute, and baked at 400° C. for 1 minute (in Examples 10 to 12, at 400° C. for 2 minutes), to form a resist underlayer film (thickness: 0.05 µm). The refractive index (n value) and the light absorption coefficient (k value, also referred to as extinction coefficient) of the resist underlayer film were measured at a wavelength of 193 nm and 248 nm using a spectroscopic ellipsometer. The results are shown in Table 1.

TABLE 1

Refractive index n and light absorption coefficient k

|  |  | n/k 193 nm | n/k 248 nm |
|---|---|---|---|
| Example 1 | Film baked at 400° C. | 1.52/0.69 | 1.70/0.56 |
| Example 2 | Film baked at 400° C. | 1.55/0.66 | 1.67/0.41 |

TABLE 1-continued

Refractive index n and light absorption coefficient k

|  |  | n/k 193 nm | n/k 248 nm |
|---|---|---|---|
| Example 3 | Film baked at 400° C. | 1.48/0.57 | 1.74/0.42 |
| Example 4 | Film baked at 400° C. | 1.52/0.66 | 1.66/0.44 |
| Comparative Example 1 | Film baked at 400° C. | 1.46/0.57 | 1.72/0.65 |

(Measurement of Dry Etching Rate)

As an etcher and an etching gas used in measurement of dry etching rate, the following etcher and gas were used.

RIE-10NR (manufactured by SAMCO INC.): $CF_4$

The solutions of the resist underlayer film-forming compositions prepared in Examples 1 to 4 and Comparative Example 1 were each applied to a silicon wafer using a spin coater, baked on a hot plate at 240° C. for 1 minute, and then baked at 400° C. for 1 minute, to form a resist underlayer film (thickness: 0.20 µm). Baking at 240° C. was not carried out and baking at 400° C. for 90 seconds was carried out. As a result, a resist underlayer film (thickness: 0.20 µm) was formed. The dry etching rate of each of the resist underlayer films was measured using a $CF_4$ gas as an etching gas. The dry etching rates of the resist underlayer films in Examples 1 to 4 and Comparative Example 1 were compared with each other. The results are shown in Table 2. The dry etching rate ratio is a ratio of the dry etching rate of (resist underlayer film)/the dry etching rate of (KrF photoresist).

TABLE 2

Dry etching rate ratio

| Example 1 | Rate ratio of film baked at 400° C. | 0.74 |
|---|---|---|
| Example 1 | Rate ratio of film baked at 400° C. after baking at 240° C. | 0.73 |
| Example 2 | Rate ratio of film baked at 400° C. | 0.74 |
| Example 2 | Rate ratio of film baked at 400° C. after baking at 240° C. | 0.73 |
| Example 3 | Rate ratio of film baked at 400° C. | 0.65 |
| Example 3 | Rate ratio of film baked at 400° C. after baking at 240° C. | 0.65 |
| Example 4 | Rate ratio of film baked at 400° C. | 0.90 |
| Example 4 | Rate ratio of film baked at 400° C. after baking at 240° C. | 0.89 |
| Comparative Example 1 | Rate ratio of film baked at 400° C. | 0.78 |
| Comparative Example 1 | Rate ratio of film baked at 400° C. after baking at 240° C. | 0.77 |

(Heat Resistance Test of Resist Underlayer Film)

The solutions of the resist underlayer film-forming compositions prepared in Examples 1 to 4 and Comparative Example 1 were each applied to a silicon wafer using a spin coater, and baked on a hot plate at 400° C. for 90 seconds, to form a resist underlayer film (thickness: 0.25 µm). The obtained film was heated by increasing the temperature from room temperature (about 20° C.) at a rate of 10° C. per minute, and thermogravimetric analysis was carried out in air. The change in weight reduction with time was monitored. The results are shown in Table 3.

TABLE 3

Temperature of weight reduction of resist underlayer film

|  | 500° C. weight reduction (%) | 550° C. weight reduction (%) |
|---|---|---|
| Example 1 (film baked at 400° C.) | 14.9 | 64.9 |

TABLE 3-continued

Temperature of weight reduction of resist underlayer film

|  | 500° C. weight reduction (%) | 550° C. weight reduction (%) |
|---|---|---|
| Example 2 (film baked at 400° C.) | 14.4 |  |
| Example 3 (film baked at 400° C.) | 15.4 |  |
| Example 4 (film baked at 400° C.) | 14.1 |  |
| Comparative Example 1 (film baked at 400° C.) | 28.4 | 84.6 |

In Examples 2 to 4, a difference was observed in measurement of 500° C. weight reduction. Therefore, the measurement data to 500° C. were adopted.

(Measurement of Amount of Sublimate of Resist Underlayer Film)

The amount of sublimate was measured using a sublimate amount measurement device described in International publication WO2007/111147. The resist underlayer film-forming composition prepared in each of Examples 1 to 4 and Comparative Example 1 was applied to a silicon wafer substrate with a diameter of 4 inches. A sample for evaluation of baking at 240° C. and a sample for evaluation of baking at 300° C. were not baked. A sample for evaluation of baking at 300° C. after a pre-treatment of baking at 240° C. was baked at 240° C. for 1 minute to form a resist underlayer film (thickness: 0.05 µm). The wafer having the resist underlayer film was set in a sublimate amount measurement device integrated with a hot plate, and baked for 120 seconds. The sublimate was collected by a quartz crystal microbalance (QCM) sensor, that was, a quartz crystal unit having an electrode. The QCM sensor can measure slight mass change using a property in which the frequency of the quartz crystal unit is changed (decreased) depending on the mass of the sublimate that is attached to a surface (electrode) of the quartz crystal unit.

A detailed measurement protocol is as follows. The temperature of the hot plate of the sublimate amount measurement device was increased to 240° C. or 300° C., the pump flow rate was set to 1 m³/s, and the device was left for first 60 seconds for stabilization. Immediately, the wafer covered with the resist underlayer film was placed on the hot plate rapidly from a slide outlet, and the sublimate was collected from a time point of 60 seconds to a time point of 180 seconds (for 120 seconds).

A flow attachment (detection part) connecting the QCM sensor of the sublimate amount measurement device to a catching funnel part was used without a nozzle. A gas flow was poured without being restricted from a flow channel (caliber: 32 mm) of a chamber unit located at a distance of 30 mm from the sensor (quartz crystal unit). The QCM sensor in which a material (AlSi) having silicon and aluminum as main components was used as an electrode, the diameter of the quartz crystal unit (sensor diameter) was 14 mm, the diameter of the electrode on a surface of the quartz crystal unit was 5 mm, and the resonant frequency was 9 MHz was used.

The obtained frequency change of eigenvalue of the quartz crystal unit used in the measurement was converted into grams, and a relationship between the sublimate amount in one wafer having the resist underlayer film and time course was clarified. In Table 4, the sublimate amounts shown by the measurement device from 0 second to 180 seconds in Examples 1 to 4 and Comparative Example 1 are described as a sublimate amount and a sublimate amount ratio. A number in parentheses is the sublimate amount ratio. The sublimate amount ratio is a value standardized on the basis of the amount of sublimate generated from the underlayer film (film baked at 300° C.) of Comparative Example 1 as 1.

TABLE 4

Measurement of sublimate amount

| Example 1 | During baking at 240° C. | 14 ng (0.01) |
| Example 1 | During baking at 300° C. after pre-treatment of baking at 240° C. | 67 ng (0.05) |
| Example 1 | During baking at 300° C. | 64 ng (0.05) |
| Example 2 | During baking at 240° C. | 0 ng (0.00) |
| Example 2 | During baking at 300° C. after pre-treatment of baking at 240° C. | 65 ng (0.05) |
| Example 2 | During baking at 300° C. | 131 ng (0.11) |
| Example 3 | During baking at 240° C. | 28 ng (0.02) |
| Example 3 | During baking at 300° C. after pre-treatment of baking at 240° C. | 82 ng (0.07) |
| Example 3 | During baking at 300° C. | 131 ng (0.11) |
| Example 4 | During baking at 240° C. | 740 ng (0.61) |
| Example 4 | During baking at 300° C. after pre-treatment of baking at 240° C. | 350 ng (0.29) |
| Example 4 | During baking at 300° C. | 301 ng (0.25) |
| Comparative Example 1 | During baking at 240° C. | 719 ng (0.59) |
| Comparative Example 1 | During baking at 300° C. after pre-treatment of baking at 240° C. | 696 ng (0.57) |
| Comparative Example 1 | During baking at 300° C. | 1219 ng (1.0) |

(In-Plane Uniformity Test of Resist Underlayer Film)

The solutions of the resist underlayer film-forming compositions prepared in Example 1 and Comparative Example 1 were each applied to a silicon wafer using a spin coater, baked on a hot plate at 240° C. for 1 minute, and then baked at 400° C. for 1 minute, to form a resist underlayer film (thickness: 0.34 µm). The in-plane uniformity was measured, and the results are shown in Table 5.

TABLE 5

In-plane uniformity of resist underlayer film

|  | Range (µm) | 3σ |
|---|---|---|
| Example 1 | $3.2 \times 10^{-3}$ | 26 |
| Comparative Example 1 | $6.1 \times 10^{-3}$ | 34 |

The resist underlayer film obtained in Example 1 exhibited high coating uniformity.

INDUSTRIAL APPLICABILITY

The present invention can provide a resist underlayer film for lithography that does not cause intermixing with a resist layer, has high dry etching resistance and high heat resistance, and generates a low amount of sublimate.

The invention claimed is:

1. A resist underlayer film containing a polymer consisting of unit structure of the following formula (1):

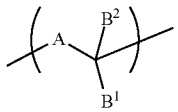

Formula (1)

wherein A is a divalent group having at least two amino groups, the divalent group is derived from a compound having an indolocarbazole structure, $B^1$ is a hydrogen atom, and $B^2$ is a hydrogen atom, an alkyl group, a benzene ring group, a condensed ring group, or a combination thereof.

2. The resist underlayer film according to claim 1, wherein $B^1$ and $B^2$ are groups derived from aldehydes or ketones having a hydrogen atom, an alkyl group, a benzene ring group and a fused ring group, which are raw materials for producing a polymer having a unit structure represented by the formula (1), respectively.

3. The resist underlayer film according to claim 1, wherein an amount of sublimate generated in 180 seconds from the resist underlayer film when baked at 300° C. is 0.25 or less.

4. The resist underlayer film according to claim 1, wherein A is a divalent group derived from the indolocarbazole structure of a compound of formula (2):

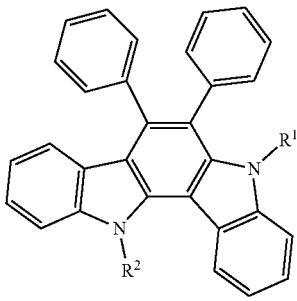

Formula (2)

wherein $R^1$ and $R^2$ are each independently a hydrogen atom, a $C_{1-10}$ alkyl group, or a $C_{6-40}$ aryl group.

5. A method for manufacturing a resist underlayer film containing a polymer having a unit structure of the following formula (1):

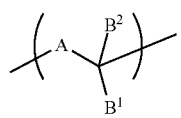

Formula (1)

wherein A is a divalent group having at least two amino groups, the divalent group is derived from a compound having an indolocarbazole structure, $B^1$ is a hydrogen atom, and $B^2$ is a hydrogen atom, an alkyl group, a benzene ring group, a condensed ring group, or a combination thereof, the method comprising applying a resist underlayer film-forming composition comprising the polymer having the unit structure of formula (1) to a substrate, followed by baking.

6. The method for manufacturing the resist underlayer film according to claim 5, wherein $B^1$ and $B^2$ are groups derived from aldehydes or ketones having a hydrogen atom, an alkyl group, a benzene ring group and a fused ring group, which are raw materials for producing a polymer having a unit structure represented by the formula (1), respectively.

7. The method for manufacturing the resist underlayer film according to claim 5, wherein an amount of sublimate generated in 180 seconds from the resist underlayer film when baked at 300° C. is 0.25 or less.

8. The method for manufacturing the resist underlayer film according to claim 5, wherein A is a divalent group derived from the indolocarbazole structure of a compound of formula (2):

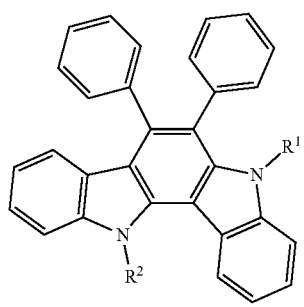

Formula (2)

wherein $R^1$ and $R^2$ are each independently a hydrogen atom, a $C_{1-10}$ alkyl group, or a $C_{6-40}$ aryl group.

* * * * *